(12) United States Patent
Karabed

(10) Patent No.: US 6,415,415 B1
(45) Date of Patent: Jul. 2, 2002

(54) SURVIVAL SELECTION RULE

(75) Inventor: Razmik Karabed, San Jose, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/465,521

(22) Filed: Dec. 16, 1999

Related U.S. Application Data

(60) Provisional application No. 60/152,476, filed on Sep. 3, 1999.

(51) Int. Cl.[7] ............................................. H03M 13/41
(52) U.S. Cl. ....................................................... 714/795
(58) Field of Search ........................................ 714/795

(56) References Cited

U.S. PATENT DOCUMENTS

| | | | |
|---|---|---|---|
| 4,888,779 A | 12/1989 | Karabed et al. ............... 371/43 |
| 4,939,555 A | 7/1990 | Calderbank et al. ........... 375/17 |
| 5,040,191 A | 8/1991 | Forney, Jr. et al. ........... 375/39 |
| 5,111,483 A | 5/1992 | Serfaty ......................... 375/94 |
| 5,181,209 A | 1/1993 | Hagenauer et al. ........... 371/43 |
| 5,214,672 A | 5/1993 | Eyuboglu et al. ............. 375/34 |
| 5,291,499 A | 3/1994 | Behrens et al. ............... 371/43 |
| 5,327,440 A | 7/1994 | Fredrickson et al. ......... 371/43 |
| 5,349,608 A | 9/1994 | Graham et al. ............... 375/94 |
| 5,377,133 A | 12/1994 | Riggle ......................... 364/736 |
| 5,406,570 A * | 4/1995 | Berrou et al. ................ 375/341 |
| 5,412,669 A | 5/1995 | Foland, Jr. ................... 371/43 |
| 5,418,795 A | 5/1995 | Itakura et al. ................ 371/30 |
| 5,450,338 A | 9/1995 | Oota et al. ................... 364/715.1 |
| 5,497,384 A | 3/1996 | Fredrickson et al. ......... 371/43 |
| 5,537,445 A * | 7/1996 | Blaker et al. ................ 375/341 |
| 5,684,811 A * | 11/1997 | Doran ......................... 714/792 |
| 5,689,532 A | 11/1997 | Fitzpatrick .................. 375/341 |
| 5,691,993 A | 11/1997 | Fredrickson ................ 371/38.1 |
| 5,754,352 A | 5/1998 | Behrens et al. ............... 360/51 |
| 5,757,294 A | 5/1998 | Fisher et al. .................. 341/57 |
| 5,784,392 A * | 7/1998 | Czaja et al. ................... 714/786 |
| 5,809,080 A | 9/1998 | Karabed et al. .............. 375/263 |
| 5,809,081 A | 9/1998 | Karabed et al. .............. 345/263 |
| 5,812,334 A | 9/1998 | Behrens et al. ............... 360/40 |
| 5,841,818 A | 11/1998 | Lin et al. ..................... 375/341 |
| 5,844,738 A | 12/1998 | Behrens et al. ............... 360/44 |
| 5,844,741 A | 12/1998 | Yamakawa et al. ........... 360/65 |
| 5,844,922 A | 12/1998 | Wolf et al. ................... 371/43.1 |
| 5,857,002 A | 1/1999 | Melas ......................... 375/290 |
| 5,881,075 A | 3/1999 | Kong et al. ................. 371/43.7 |
| 5,928,378 A | 7/1999 | Choi ........................... 714/795 |
| 6,038,269 A * | 3/2000 | Raghavan .................... 375/340 |
| 6,084,925 A * | 7/2000 | Baek ........................... 375/341 |

OTHER PUBLICATIONS

McEliece et al., "Truncation Effects in Viterbi Decoding", IEEE Conf. Military Commun., vol. 1, Oct. 1989, pp. 171–178.*

Kubota et al., "Novel Viterbi Decoder VLSI Implementation and its Performance", IEEE Transactions on Communications, vol. 41, No. 8, Aug. 1993, pp. 1170–1178.*

* cited by examiner

Primary Examiner—Stephen Baker
(74) Attorney, Agent, or Firm—Fish & Richardson P.C.

(57) ABSTRACT

A survival selection rule for determining a Viterbi output. A survival selection rule according to the present invention compares paths at a plurality of endpoint states but fewer than the total number of endpoint states. Viterbi detectors using the present invention provide high performance, easier implementation, and error degradation comparable to conventional methods.

12 Claims, 3 Drawing Sheets

SURVIVAL SELECTION RULE

CROSS-REFERENCE TO RELATED APPLICATIONS

This application claims priority from U.S. Provisional Application Ser. No. 60/152,476, filed Sep. 3, 1999.

BACKGROUND OF THE INVENTION

1. Field of the Invention

The present invention relates to encoding for disk drives and, particularly, to an improved Viterbi detector for sampled amplitude read channels.

2. Description of the Related Art

Viterbi decoders are typically employed in sampled amplitude channels. Viterbi decoders are specific implementations of the Viterbi algorithm. A Viterbi detector unit is based on periodic examination of metrics associated with alternate sequences of recorded bits, wherein each sequence is typically labeled as a "path" and the associated metric is designated a "path metric." The most probable path is then determined by choosing a minimum path metric based on an iterative process involving successive comparison of associated path metrics. This is illustrated by way of example in FIG. 1, which shows an exemplary trellis for a partial response channel. In particular, as shown in FIG. 1, a Viterbi detector is characterized by a labeled trellis H having Q states $s_1, s_2, \ldots, s_Q$. In the example shown, Q=4. For each state s and each time k, a metric $m_s(k)$, a survivor sequence $ss_s(k)$, metric/survivor sequence update rules, and an initial state s* are defined. In the example illustrated, s* is the state $s_1$ at time k−4. Given a state s (e.g., state 100) and a time k, the survivor sequence $ss_s(k)$ is a label sequence in H starting from s* at time zero and ending on s at time k. Usually, only the last t labels of each survivor sequence are saved. The parameter t is called the truncation depth of the Viterbi detector. Thus, in FIG. 1, t=4.

In traditional Viterbi detectors, the updating rules are as follows. Let $s_1, s_2, \ldots, s_q$ be the predecessor states to the state s. And let $h_i$ be the label on the edge from $s_i$ to s. Further, let $r_k$ be the current value of the received sequence. Then, the updating rules are:

Update $m_s(k)$: $m_s(k) = \min\{m_{s_1}(k-1)+(r_k-h_1)^2, \ldots, m_{s_q}(k-1)+(r_k-h_q)^2\}$.

Update $ss_s(k)$: If the $j^{th}$ state, $s_j$, produces the minimum above $(m_s(k))$, then $ss_s(k)=(ss_{s_j}(k-1), h_j)$.

For every state, s, and time, k, let $v_s$=(last t coordinates of $ss_s(k)$). In general, the output of a Viterbi detector at time k, Y(k), is a function of $(v_{s1}(1), v_{s2}(1), \ldots, v_{sQ}(1); m_{s1}(k), m_{s2}(k), \ldots, m_{sQ}(k))$, as shown:

$Y(k) = F(v_{s1}(1), v_{s2}(1), \ldots, v_{sQ}(1); m_{s1}(k), m_{s2}(k), \ldots, m_{sQ}(k))$.

A first conventional implementation of the function F is shown below:

F1 $(v_{s1}(1), v_{s2}(1), \ldots, v_{sQ}(1); m_{s1}(k), m_{s2}(k), \ldots, m_{sQ}(k)) = v_{sw}(1)$, for a fixed w.

That is, the Viterbi detector output at time k is determined to be the output at a particular state w. For example, in FIG. 1, an arbitrary state w is state 52. According to F1, the Viterbi output is the path ending at state 52 for which the metric is minimized.

Another conventional implementation is shown below:

$F2(v_{s1}(1), v_{s2}(1), \ldots, v_{sQ}(1); m_{s1}(k), m_{s2}(k), \ldots, m_{sQ}(k)) = v_{sw}(1)$, where $m_{sw}(k) = \min\{m_{s1}(k), m_{s2}(k), \ldots, m_{sQ}(k)\}$.

F2 thus determines a path metric for each state at time k (e.g., states 50, 52, 54, and 56) and the output of the Viterbi detector is the sequence which minimizes the branch metrics over all the states and all possible paths.

The function F1 is easy to implement, but F2 is a better function—it produces fewer detector errors. However, when Q is large F2 is not easy to implement.

SUMMARY OF THE INVENTION

These and other drawbacks in the prior art are overcome in large part by a system and method according to the present invention. In particular, a survival selection rule according to the present invention compares paths at a plurality of endpoint states but fewer than the total number of endpoint states.

BRIEF DESCRIPTION OF THE DRAWINGS

A better understanding of the invention is obtained when the following detailed description is considered in conjunction with the following drawings in which.

DETAILED DESCRIPTION OF THE INVENTION

FIGS. 1–4 illustrate a Viterbi detector implementation according to the present invention. A map F3 is defined, according to the present invention, that is easier to implement than the map F2 described above and yet does not substantially degrade system performance. Briefly, the present invention relates to a survival selection rule for a Viterbi detector, in which survival sequences are determined for a plurality of end states that is fewer than the total number of end states. In one specific implementation, a pair of end states are used.

Figure 2:
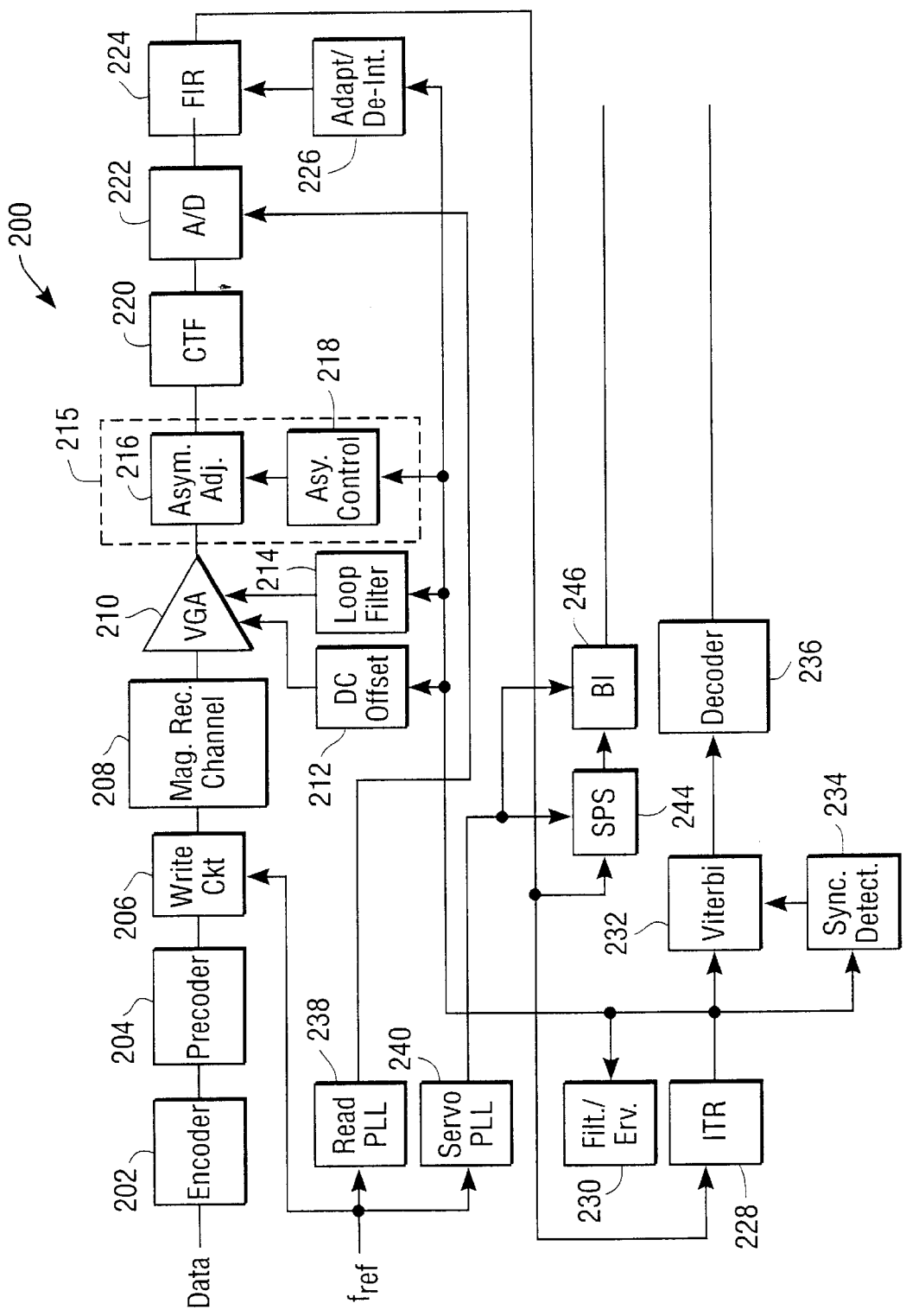
FIG. 2 is a diagram of an exemplary read/write channel according to the present invention.

Turning now to the drawings and, with particular attention to FIG. 2, a block diagram of a sampled amplitude read channel according to an embodiment of the invention is shown and identified by the reference numeral 200. As will be discussed in greater detail below, the sampled amplitude read channel 200 may implement a Viterbi detector according to the present invention.

During a write operation, data are written onto the media. The data are encoded in an encoder 202, such as an RLL or other encoder. A precoder 204 precodes the sequence to compensate for the transfer function of the magnetic recording channel 208 and equalizing filters. As will be discussed in greater detail below, the encoder/precoder may encode the data such that after precoding the data has a pre-determined parity structure. Turning back to FIG. 2, the write circuitry 206 modulates the current in the recording head coil to record a binary sequence onto the medium. A reference frequency $f_{ref}$ provides a write clock to the write circuitry 206.

The bit sequence is then provided to a variable gain amplifier 210 to adjust the amplitude of the signal. DC offset control 212 and loop filter/gain error correction 214 may be provided to control the adjustment of the VGA 210. Further, an asymmetry control unit 215 including an asymmetry adjustment unit 216 and asymmetry control 218 may be provided to compensate for magneto-resistive asymmetry effects.

The signal is then provided to a continuous time filter 220, which may be a Butterworth filter, for example, to attenuate high frequency noise and minimize aliasing into baseband after sampling. The signal is then provided to an analog to digital converter 222 to sample the output of the continuous time filter 220.

A finite impulse response filter 224 provides additional equalization of the signal to the desired response. The output of the FIR 224 is provided to an interpolated timing recovery unit 228, which is used to recover the discrete time sequence. The output of the interpolated timing recovery unit is used to provide a feedback control to the DC offset control 212, the gain error 214, the asymmetry control 218 and the FIR 224 control 226. The output of the interpolated timing recovery 228 is provided to a Viterbi detector 232 according to the present invention. Further, the ITR output is provided to a sync detector 234. Sync mark information is then provided to the Viterbi detector 232 for use in sequence detection. The Viterbi detector output is then provided to the decoder 236 which decodes the encoding provided by the encoder 202. The Viterbi detector 232 may implement the survival selection rule described below.

Figure 1:
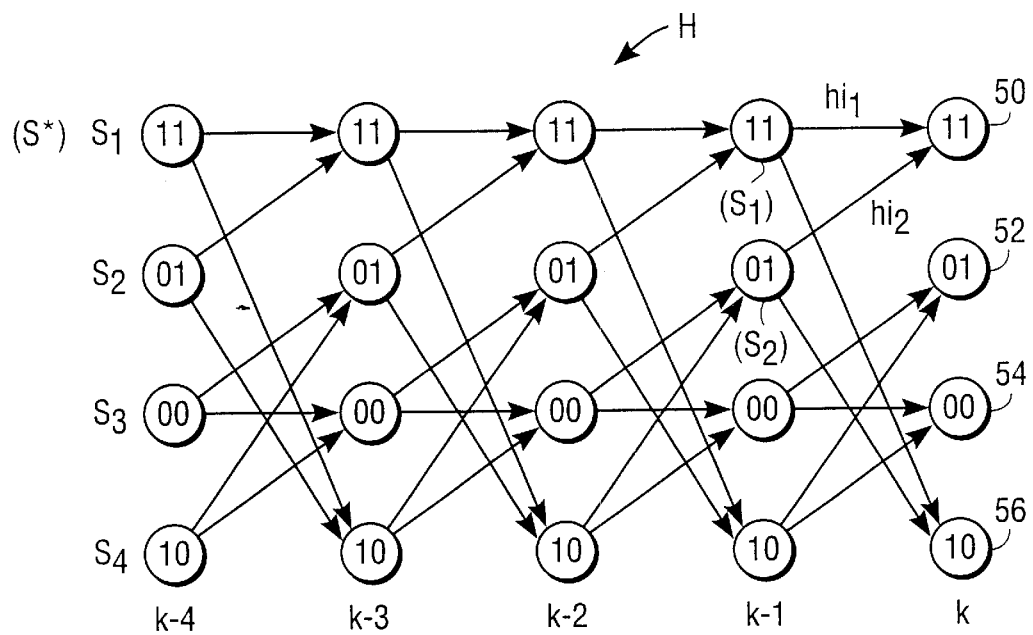
FIG. 1 is an exemplary Viterbi trellis.
Figure 3:
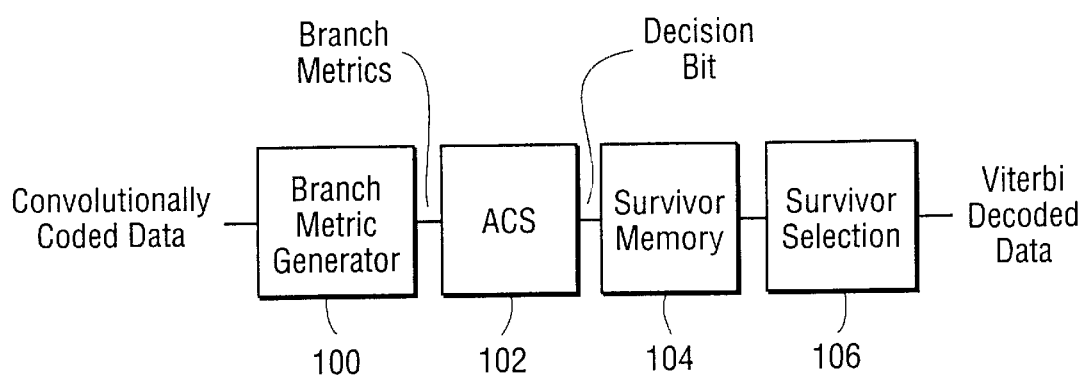
FIG. 3 is a diagram illustrating an exemplary Viterbi detector for the read/write channel of FIG. 1.

FIG. 3 illustrates a Viterbi detector 232 employing a survival selection rule according to an implementation of the present invention. The Viterbi detector includes a branch metric generator 100, an add-compare-select (ACS) unit 102, a survivor memory 104 and a survival selection rule 106 according to the present invention. The branch metric generator 100 receives convolutionally-coded data and calculates a branch metric, which is a distance between labels on each branch from a received signal. The ACS unit 102 receives the branch metrics from the branch metric generator 100, adds them to the previous path metric, and determines a plurality of candidate paths. The ACS 102 then compares the plurality (at least two but fewer than the total number of end states) of ACS path metric values and selects a path having the shortest path metric, and outputs the newly selected path metric and the compared result, namely the decision bit. The ACS unit 102 updates the path metric by using the branch metric obtained from the branch metric generator 100 at each decoding cycle and outputs the Q decision bits (one for each state) to the survivor memory 104. The survivor memory 104 updates each state with the information from the ACS unit 102. Finally, the survival selection rule 106 picks one state and survivor according to a map F3 described below.

The map F3 is described with reference to a pair of end states, it being understood that the invention is not so limited:

Definition 1: Given a state s and an integer p, let G (s, p)={ all states on the detector trellis that can reach s in p steps}.

Definition 2: Given two states s' and s", let D(s's")= minimum p such that G(s',p)∩G(s",p)≠ϕ.

Then the map F3 may be defined as follows:

Let $F3(v_{s1}(k),v_{s2}(1), \ldots ,v_{sQ}(1):m_{s1}(k),m_{s2}(k), \ldots , m_{sQ}(k)) = v_{sw}(1)$, where $m_{sw}(k) = \min\{m_{s'}(k),m_{s''}(k)\}$, for two fixed states s' and s". Further, let s' and s" be two states with large D(s',s").

EXAMPLE

Figure 4:
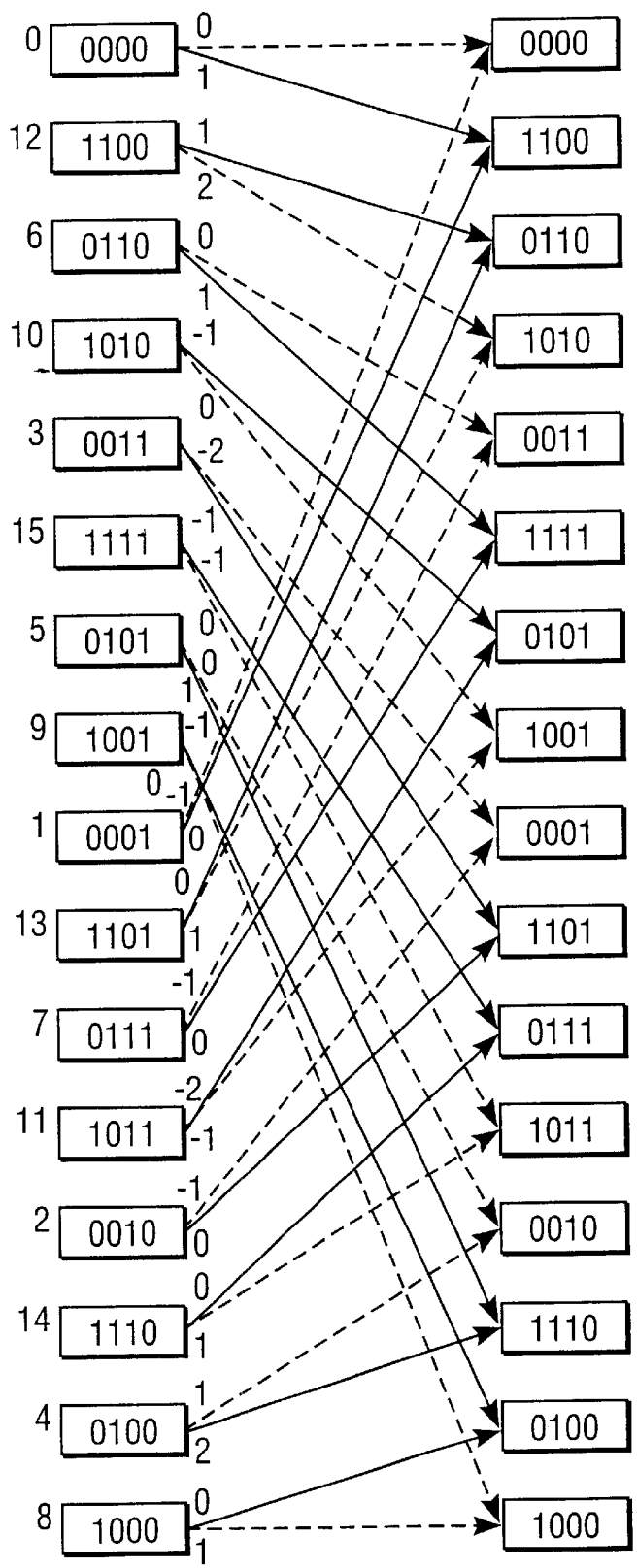
FIG. 4 is a diagram of an exemplary trellis.

This example shows the comparative performance made for a particular trellis between the maps F1 F2, and F3. FIG. 4 depicts a trellis H1 having sixteen states (Q=16). States are denoted by rectangular boxes. Each state is numbered. The number of a state is shown in its corresponding box with a binary four-tuple. There are two labeled edges emerging from every state. The trellis H1 may be used in an E2PRML system.

In addition to using the trellis H1, the Viterbi detector, as tested, forced the state survivors not to go through states 8–15 every 52 clock cycles. To apply F3, the following states were selected: s'=0 and s"=8, resulting in D(s',s")=4.

The table shows the number of detector errors in 1M runs for truncation depths t=60, 67, and 77, and maps F1, F2, and F3.

| RULE | t = 60 | t = 67 | t = 77 |
|------|--------|--------|--------|
| F1   | 612    | 472    | 365    |
| F2   | 261    | 260    | 260    |
| F3   | 280    | 275    | 273    |

As can be seen, the number of errors for the example of a large Q=16 when using the map F3 according to the present invention is comparable to that achieved when using the map F2. Nevertheless, the map F3 requires fewer comparisons of path metric values and is relatively easier to implement than the map F2.

What is claimed:

1. A method for survival selection in a Viterbi detector, comprising:

selecting a plurality of end states fewer than a totality of said end states; and selecting a Viterbi output by determining a minimum path metric for paths ending at said plurality of end states.

2. A method according to claim 1, wherein said plurality is two.

3. A method according to claim 2, said selecting a plurality of end states comprising:

selecting two states, s' and s", having a predetermined D(s',s"), where D(s's")=minimum p such that G(s', p)∩G(s", p)≠ϕ, where G (s, p)={ all states on the detector trellis that can reach state s in p steps}.

4. A method according to claim 3, wherein said selecting a Viterbi output comprises defining a map F3 such that $$F3(v_{s1}(1),v_{s2}(1), \ldots ,v_{sQ}(1):m_{s1}(k),m_{s2}(k), \ldots , m_{sQ}(k)) = v_{sw}(1),$$

where $m_{sw}(k) = \min\{m_{s'}(k), m_{s''}(k)\}$, for two fixed states s' and s", $v_s(k)$ are survival sequences, and $m_s(k)$ are branch metrics.

5. A Viterbi detector, comprising:

a survival selection unit adapted to select a plurality of end states fewer than a totality of said end states and select a Viterbi output by determining a minimum path metric for paths ending at said plurality of end states.

6. A Viterbi detector according to claim 5, wherein said plurality is two.

7. A Viterbi detector according to claim 6, said survival selection unit adapted to select said plurality of end states by selecting two states, s' and s", having a predetermined D(s',s"), where D(s',s")=minimum p such that G(s', p)∩G(s", p)≠ϕ, where G (s, p)={ all states on the detector trellis that can reach state s in p steps}.

8. A Viterbi detector according to claim 7, wherein said survival selection unit is adapted to select said Viterbi output by defining a map F3 such that $F3(v_{s1}(1), v_{s2}(1), \ldots, v_{sQ}(1):m_{s1}(k), m_{s2}(k), \ldots, m_{sQ}(k))=v_{sw}(1)$, where $m_{sw}(k)=\min\{m_{s'}(k), m_{s''}(k)\}$, for two fixed states s' and s", $v_s(k)$ are survival sequences, and $m_s(k)$ are branch metrics.

9. A sampled amplitude read channel, comprising means for receiving encoded data; and a Viterbi detector operably coupled to said receiving means, said Viterbi detector including a survival selection unit adapted to select a plurality of end states fewer than a totality of said end states and to select a Viterbi output by determining a minimum path metric for paths ending at said plurality of end states.

10. A sampled amplitude read channel according to claim 9, wherein said plurality is two.

11. A sampled amplitude read channel according to claim 10, said survival selection unit adapted to select said plurality of end states by selecting two states, s' and s", having a predetermined D(s',s"), where D(s',s")=minimum p such that $G(s', p) \cap G(s'', p) \neq \phi$, where G(s, p)={ all states on the detector trellis that can reach state s in p steps}.

12. A sampled amplitude read channel according to claim 7, wherein said survival selection unit is adapted to select said Viterbi output by defining a map F3 such that $F3(v_{s1}(1), v_{s2}(1), \ldots, v_{sQ}(1):m_{s1}(k), m_{s2}(k), \ldots, m_{sQ}(k))=v_{sw}(1)$, where $m_{sw}(k)=\min\{m_{s'}(k), m_{s''}(k)\}$, for two fixed states s' and s", $v_s(k)$ are survival sequences, and $m_s(k)$ are branch metrics.

* * * * *